US 9,761,740 B2

(12) United States Patent
Reinert

(10) Patent No.: US 9,761,740 B2
(45) Date of Patent: Sep. 12, 2017

(54) ELECTROMAGNETIC RADIATION MICRO DEVICE, WAFER ELEMENT AND METHOD FOR MANUFACTURING SUCH A MICRO DEVICE

(75) Inventor: Wolfgang Reinert, Neumünster (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 14/384,318

(22) PCT Filed: Mar. 23, 2012

(86) PCT No.: PCT/EP2012/055249
§ 371 (c)(1),
(2), (4) Date: Sep. 10, 2014

(87) PCT Pub. No.: WO2013/139403
PCT Pub. Date: Sep. 26, 2013

(65) Prior Publication Data
US 2015/0048470 A1  Feb. 19, 2015

(51) Int. Cl.
G01J 5/08 (2006.01)
H01L 31/0216 (2014.01)
(Continued)

(52) U.S. Cl.
CPC ........ *H01L 31/02165* (2013.01); *G01J 5/024* (2013.01); *G01J 5/0215* (2013.01);
(Continued)

(58) Field of Classification Search
CPC ............... G01J 5/045; G01J 5/046; G01J 5/08
(Continued)

(56) References Cited

U.S. PATENT DOCUMENTS

2006/0087739 A1*  4/2006 Ockenfuss et al. ............ 359/588
2009/0020703 A1*  1/2009 Buckley ................ G01J 5/0022
                                                    250/338.3
2009/0217516 A1   9/2009 Pawlowski et al.
2010/0022053 A1   1/2010 Mund et al.

FOREIGN PATENT DOCUMENTS

DE       102006032047 A1    1/2008
EP           0734589 B1      3/1998
(Continued)

OTHER PUBLICATIONS

Handbook of Silicon Based MEMS Materials and Technologies, Editor: Jeremy Ramsden, 2010, excerpt of first pp. ix to xxxii.
(Continued)

Primary Examiner — Julio J Maldonado
Assistant Examiner — Hajar Kolahdouzan
(74) Attorney, Agent, or Firm — Duane Morris LLP

(57) ABSTRACT

The invention refers to an electromagnetic radiation sensor micro device for detecting electromagnetic radiation, which device comprises a substrate and a cover at least in part consisting of an electromagnetic radiation transparent material, and comprising a reflection reducing coating and providing a hermetic sealed cavity and an electromagnetic radiation detecting unit arranged within the cavity. The reflection reducing coating is arranged in form of a multilayer thin film stack, which comprises a first layer and a second layer arranged one upon the other. The first layer has a first refractive index and the second layer has a second refractive index different from the one of said first layer. First and second layer are of such layer thickness that for a certain wavelength there is destructive interference. The invention also refers to a wafer element as well as method for manufacturing such a device.

10 Claims, 5 Drawing Sheets

Figure 1:
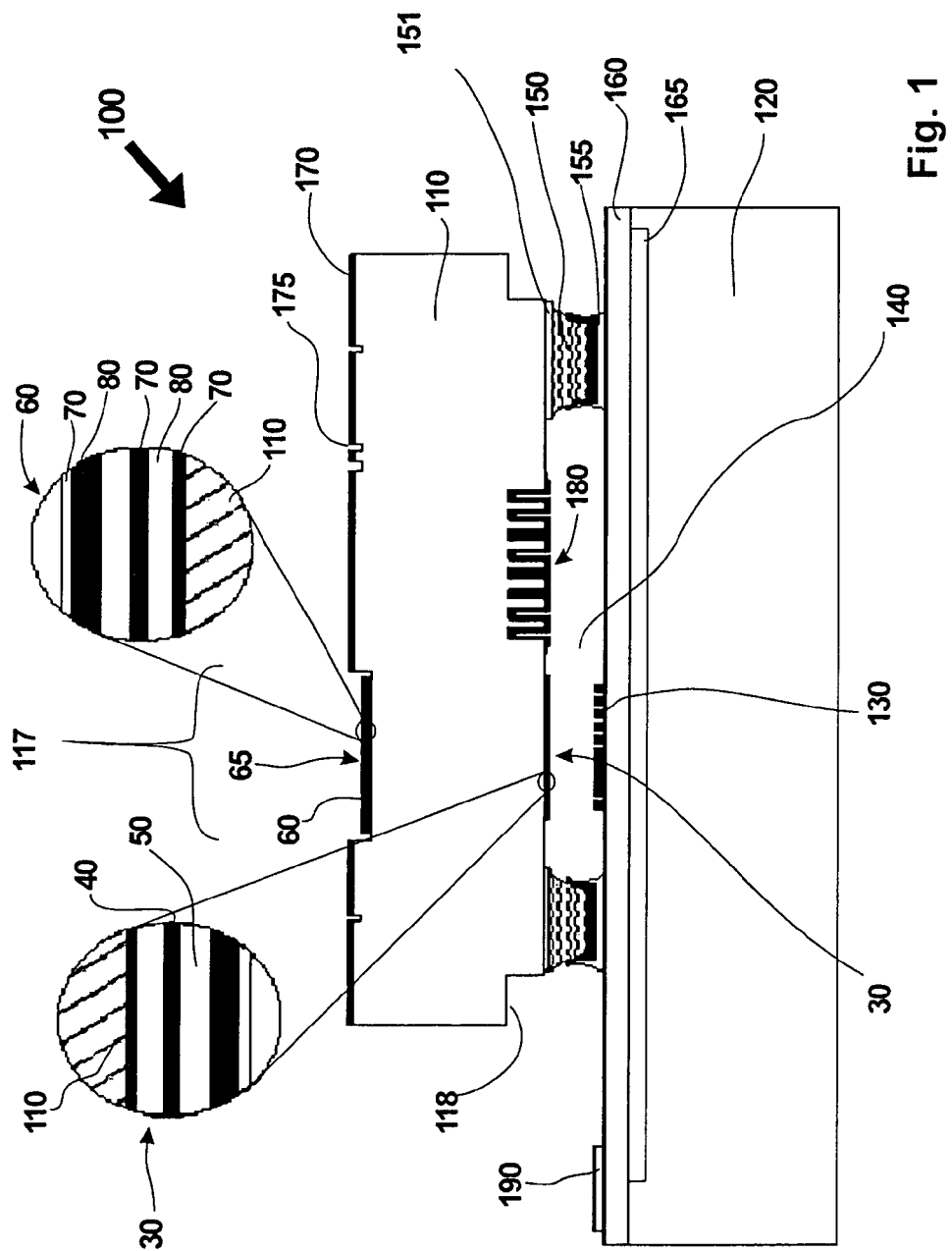

(51) Int. Cl.
*G01J 5/04* (2006.01)
*G01J 5/02* (2006.01)
*G01J 5/20* (2006.01)
*G02B 1/115* (2015.01)
*H01L 31/18* (2006.01)

(52) U.S. Cl.
CPC ............. *G01J 5/0235* (2013.01); *G01J 5/045* (2013.01); *G01J 5/046* (2013.01); *G01J 5/0803* (2013.01); *G01J 5/0806* (2013.01); *G01J 5/0862* (2013.01); *G01J 5/0875* (2013.01); *G01J 5/20* (2013.01); *G02B 1/115* (2013.01); *H01L 31/18* (2013.01)

(58) Field of Classification Search
USPC ............................................. 257/432; 438/65
See application file for complete search history.

(56) References Cited

FOREIGN PATENT DOCUMENTS

| | | | |
|---|---|---|---|
| EP | 2264765 | A1 | 12/2010 |
| FR | EP 2264765 | * | 12/2010 |
| JP | 2007 171174 | * | 7/2007 |
| JP | 2007-171174 | A | 7/2007 |
| WO | 95/17014 | A1 | 6/1995 |

OTHER PUBLICATIONS

Roland Zengerle, Duenne Siliziummembrane im Durchlicht, slides 60, 61, public lecture, Jan. 2011.
WPI/Thomson, XP-002550724, Mitsubishi Electric Corp., May 21, 2003 (see JP2003149434).

* cited by examiner

ELECTROMAGNETIC RADIATION MICRO DEVICE, WAFER ELEMENT AND METHOD FOR MANUFACTURING SUCH A MICRO DEVICE

The application relates to the field of electromagnetic radiation sensor micro devices, especially of infrared radiation micro devices, as for example micro-bolometer-sensors and thermopile sensors, micro mirrors or electromagnetic radiation emitting micro-devices. The application also refers to the packaging and the method of manufacturing of such devices, especially on wafer level.

The optical quality of electromagnetic radiation micro-devices, especially of such devices which are produced on wafer level, is a limiting criteria for the use of such devices. It is known to integrate antireflective surface modifications on the cap structure of known-devices. The modifications are based on micro structural surface textures (so called moth eye structures).

Beside the provision of micro-structured surface textures there are other possibilities to reduce inversion losses of IR-radiation. For example, an optical interface layer with reduced refractive index may be provided on the silicon material. The interface layer may be a single thin film as ALN or diamond like carbon (DLC). EP 07 34 589 (Honeywell) teaches to apply inside a cavity of an IR-sensor device an anti-reflective coating of a material other than the cover material itself.

One problem of known-surface textures and single layer thin film depositions is, that it is not possible to provide it for a filtering ability, such that for example short IR-wavelengths <8 µm can be suppressed and do not transmit through the cap structure. The missing filter ability is critical for example for IR-sensors, as short IR-wavelengths arising from direct or indirect illumination with sunlight or other light sources may enter into the sensor, such that IR-pictures of an object to be measured may be blurred or just falsified (too hot) in temperature measurement.

To overcome the above mentioned drawback it is known to provide an additional filter window within IR-optics in the optical path before the sensor element. Beside high costs of such a filter plate, the additional absorption of IR-radiation within the filter itself may be critical.

Based on the above prior art, it is the object of the present invention to provide an electromagnetic radiation sensor micro-device and a wafer element as well as a method for production of such a micro-device and wafer element, wherein transmission of IR-radiation—especially in the range of 8 to 12 µm—is improved, while at the same time transmission of short IR-wavelengths <8 µm generally may be suppressed.

The solution on the device side for the above object is an electromagnetic radiation micro device for detecting electromagnetic radiation, comprising a substrate and a cover providing an hermetic sealed cavity and an electromagnetic radiation detecting unit and/or emitting unit and/or deflection unit arranged within the cavity, at least one of the substrate and the cover at least in part consisting of an electromagnetic radiation transparent material and comprising a reflection reducing coating, wherein said reflection reducing coating is arranged in form of a multi-layer thin film stack, wherein said multi-layer thin film stack comprises at least a first layer and at least a second layer arranged one upon the other, wherein said first layer has a first refractive index, wherein said second layer has a second refractive index different from the first refractive index of said first layer, wherein said first layer and said second layer are of such layer thickness, that for a certain range of wavelength of electromagnetic radiation there is destructive interference (claim 1). The electromagnetic radiation micro device according to the invention especially may be a electromagnetic radiation sensor micro device.

A further solution on the device side is a wafer element for an electromagnetic radiation micro device, especially for an electromagnetic radiation sensor micro device according to one of the claims 1 to 9, consisting at least in part of an electromagnetic radiation transparent material and comprising reflection reducing coating, wherein said reflection reducing coating is arranged in form of a multi-layer thin film stack, wherein said multi-layer thin film stack comprises at least a first layer and at least a second layer arranged one upon the other, wherein said first layer has a first refractive index, wherein said second layer has a second refractive index different from the first refractive index of said first layer, wherein said first layer and said second layer are of such layer thickness, that for a certain range of wavelength of electromagnetic radiation there is destructive interference (claim 18).

In the following, the invention will be described with relation to an electromagnetic radiation sensor micro device; however, this description has also to be understood with reference to the wafer element for such an electromagnetic radiation micro device. A device according to the invention especially may be a micro bolometer. The device according to the invention generally may be adapted for emitting electromagnetic radiation, deflecting IR radiation or alternatively or additionally to detecting radiation.

The electromagnetic radiation sensor micro device/wafer according to the invention comprises a reflection reducing coating reducing reflection of incoming electromagnetic radiation, which coating at the same time can act as a filter device filtering certain elected ranges of wavelength of incoming radiation. In a preferred embodiment, the idea of the invention is integration of an IR-low pass filter in vacuum wafer level package constructions to improve transmission of radiation of certain wavelengths through the device housing while at the same time blocking undesired wavelengths or ranges of wavelength. In this concern a low pass filter means a filter device that blocks short wavelengths (which have a high frequency). A sensor micro device/wafer according to the invention especially may be adapted to improve the transmission of infrared radiation through the material of substrate and/or cover while at the same time blocking short infrared wavelengths in a range of about 1 µm to 7.5 µm, preferably 2.5 µm to 5.5 µm. The cut off wavelength, i.e. the wavelength below which incoming electromagnetic radiation essentially is blocked is preferably in the range of 5 µm to 9 µm, more appreciated in the range of 5.5 µm to 8 µm. The cut off wavelength can be blocked completely or partially, preferably to such an extent that the residual radiation transmitting the filter and entering into the housing is below 5%, preferably below 1%, of total radiation.

The electromagnetic radiation sensor micro device according to the invention comprises a substrate and a cover. During production of the device, the substrate and the cover preferably are provided in form of wafers according to the invention. The device preferably is produced on wafer level with a plurality of devices preferably in matrix order and finally singularized. Suitable materials for substrate, cover and the respective wafers are for example silicon and germanium for the cover only. Other materials are also possible, as long as a part of substrate and/or cover is made of an electromagnetic radiation transparent material, in which case this part provides an electromagnetic radiation window, through which radiation may permeate cover and substrate, respectively. Cover and substrate provide a hermetic sealed cavity there between, in which cavity there is provided at least one radiation detecting unit. Additionally or alternatively there may be provided an electromagnetic emitting unit. When in the following reference is made to a detecting unit, this has to be understood as also relating to an emitting unit. The radiation detecting unit preferably may be in form of a single detecting/emitting micro structure or a line or an array of radiation detecting/emitting microstructures, especially of IR sensitive microstructures. The radiation detecting unit may be a thermal resistive micro bolometer as well as a thermoelectric thin film sensor and a semiconductor sensor. A thermal resistive micro bolometer is thermally isolated and its conductance varies depending from absorption of IR radiation.

To enhance the penetration and to diminish the loss of incoming radiation, at least one of substrate and cover and accordingly the wafer is at least partly provided with a reflection reducing coating, completely or only in the area of the electromagnetic radiation window. The reflection reducing coating provides an optical interface layer or optical interface layer system, which refractive index preferably lies between the refractive index of air or vacuum and the refractive index of the material of cover, substrate and wafer, respectively. The refractive index should be in the range between 1 and 3.45, most preferred in a range in the middle of this range, for example in the range between 1.7 and 2, most preferred about 1.84, especially in the case of the material being silicon. The optical interface layer or optical interface layer system may comprise a surface texture, a single thin film as AlN or diamond like carbon (DLC) or another adequate material, or a multi-layer thin film stack of e.g. Ge and ZnS.

In a preferred embodiment the multi-layer thin film stack comprises a germanium layer (Ge-layer) as said first layer and a zink sulfide layer (ZnS-layer) as said second layer. From what was known from the state of the art, Ge—ZnS layers were believed not to be compatible to high temperatures which cause problems in relation to production steps performed on such high temperatures, as for example eutectic bonding and thermal getter activation. However, the applicants became aware by own experiments that a thin film stack of Ge-layers and ZnS-layers can be adapted to withstand temperatures up to 350° C. to 400° C., which temperatures arise during wafer bonding as well as getter activation. In a further embodiment, the multi-layer thin film stack comprises a germanium layer (Ge-layer) as said first layer and a zink selenide layer (ZnSe-layer) as said second layer.

According to the general idea of the invention, the reflection reducing coating is arranged in form of a multi-layer thin film stack. This multi-layer thin film stack comprises at least a first layer and at least a second layer which layers are arranged one upon the other. By providing the reflection reducing coating in form of a multi-layer thin film stack, filtering properties are achieved and the thin film stack is adapted to act—beside its ability to reduce reflection—as an electromagnetic radiation filter. The first layer has a first refractive index and the second layer has a second refractive index different from the first refractive index of said first layer. Additionally, first and second layer are of such layer thickness, that for a certain range of wavelength of electromagnetic radiation, which range of wavelength has to be filtered or blocked, there occurs destructive interference. Due to their different refractive index at the boundary interfaces of the layers there occurs partly reflection of incoming electromagnetic radiation. Destructive interference occurs if the distance of the boundary interfaces i.e. the layer thickness is such that radiation reflected at the interfaces interferes with incoming radiation and there is a cancellation of certain wavelengths or ranges of wavelengths. By an adequate selection of layer thickness the range of wavelength to be blocked or filtered may be determined.

Of course there may be additional layers beside the first and the second layer, for example in form of third or further layers. The number of each layer may be one or more such that the multi-layer thin film stack can comprise several first layers and an equal or different number of second layers and/or third or additional layers. The expressions first layer, second layer, third layer and further layer as used in the present application describe different layers with certain properties, for example layers of a certain material and/or of a certain layer thickness. The expressions need not to have the limiting meaning that the first layer is arranged first on (adjacent to) the substrate or the cover and that the second layer is arranged adjacent to the first layer on its substrate/cover far side as the case may be followed by a third layer, although this is in the scope of the invention. According to a preferred embodiment of the invention the first layer may be a germanium layer and the second layer may be a zink sulfide layer. There may be only one germanium layer and one zink sulfide layer or there may be several germanium layers and several zink sulfide layers stacked on upon the other. It is preferred that the layers are arranged in an alternating manner. Additionally, it is preferred that a germanium layer is used for one or both of a connecting layer and a final layer due to its hardness and chemical resistance.

The absorption characteristics of the multi-layer thin film stack are characterized especially by the layer thickness of the first to further layers. Depending from the thickness of the layers electromagnetic radiation of different ranges of wavelength can be filtered. According to a preferred embodiment different and/or several multi-layer thin film stacks may be provided on at least one of the substrate and the cover. Each multi-layer thin film stack then comprises first to further layers of a specific layer thickness and the layer thicknesses differ from thin film stack to thin film stack. For example, a first multi-layer thin film stack comprises a first layer and a second layer each of a first layer thickness, while a second multi-layer thin film stack comprises a first layer and a second layer of a second layer thickness different from the first layer thickness. By this, it is possible to block a blurred range of incoming radiation, because the first multi-layer thin film stack blocks a first range of wavelength (due to its first layer thickness) while the second multi-layer thin film stack blocks a second, different range of wavelength (due to its different layer thickness).

According to a further embodiment there is at least one reflection reducing coating or surface texture or at least one multi-layer thin film stack provided on each side of at least one of the cover and the substrate. This has certain advantages. Reflection of incoming radiation on optical interface boundaries—between the material of cover and substrate, respectively—may not only be reduced when radiation enters into the material (entry of radiation into the material), but also when radiation leaves said material and—in the case of a device—enters into the device cavity (exit of radiation out of the material), in which cavity usually there are vacuum conditions. Further, the device may be provided as an electromagnetic radiation detecting as well as emitting device as well as a detecting and emitting device and electromagnetic radiation deflecting devise (scanner), as also losses due to reflection of radiation emitted by a radiation source provided in the device cavity may be reduced or minimized. By choosing an adequate design of the multi-layer thin film stack as well as adequate or optimized production steps thereof, for example etching, liftoff and shadow mask procedures, layer stress and structuring can be handled.

With the invention it is possible to separate the anti-reflective filter into discrete blocking units that can be deposited on both sides of each, the substrate/substrate wafer and the cover/cover wafer, or on both sides of the substrate/substrate wafer or the cover/cover wafer. For example, on one side of the at least one of the cover and the substrate a first multi-layer thin film stack with a first stack thickness (for example between about 11 µm to 30 µm) (acting as an electromagnetic radiation filter) is provided, while on an opposite side a second multi-layer thin film stack with a second stack thickness (between about 2 µm to 5 µm) acting as an antireflective coating is provided, wherein the first stack thickness is thicker than the second stack thickness. Due to an adequate selection of layer or stack thickness and the production steps necessary for their production layer stress of the layers of the multi-layer thin film stacks as well as bending of the overall device due to such layer stress may be controlled. This is an essential property for vacuum wafer bonding. For example, the first multi-layer thin film stack (with higher thickness) may be deposited under lower temperature than the second multi-layer thin film stack (with lower thickness). A temperature induced higher bending of thinner layers/stacks then may be balanced by a lesser temperature induced bending of thicker layers/stacks, such that in the result bending due to layer/stack stress may be reduced while on both sides of cover/substrate anti-reflex properties plus filter functionality may be achieved.

With the invention it is also possible to separate the anti-reflective filter into discrete blocking units, wherein each unit blocks or filters a certain range of wavelength (depending on the respective layer thickness). According to a preferred embodiment several multi-layer thin film stacks may be arranged one upon the other, wherein each multi-layer thin film stack comprises at least a first layer and at least a second layer arranged one upon the other. The layer thicknesses of said first and second layers of a first multi-layer thin film stack may be different from layer thicknesses of said first and second layers of a second multi-layer thin film stack. By this, the first multi-layer thin film stack filters a first range of wavelength, while the second multi-layer thin film stack filters a second, different range of wavelength. If several multi-layer thin film stacks with different layer thicknesses each are used, specific filtering properties can be designed. The different multi-layer thin film stacks can be deposited on one or both sides of the substrate and/or the cover or, as the case may be, on one or both sides of the substrate wafer/or the cover wafer, such that also with different discrete blocking units the above mentioned reduction of bending due to layer stress can be achieved. According to a preferred embodiment of the invention, the thicker multi-layer stack is deposited on the outer surface of the cover/cover wafer (substrate for surface) to increase the focal distance particles or other defects in the multi-layer stack may have on the IR sensing or emitting functionality of the device. The layer defect density increases with stack thickness.

Beside of the deposition on flat surfaces of substrate, cover and wafer, respectively, it is possible to coat surfaces of substrate/cover/wafer of an optical active shape. For this aim, at least one of the substrate and the cover and accordingly the wafer at least partly is designed in form of an optical element. Such a shape, for example can be a lens shape or a micro-lens array shape. The optical element preferably is partly or completely covered by at least one multi-layer thin film stack according to the invention. By this, wafer level optics, wafer level lens optics and wafer level IR-optics with enhanced reflection and filtering characteristics can be provided. Miniaturized radiation detecting devices can be built that may not require additional optical elements. In addition, such devices offer very short radiation transmission path increasing the signal amplitude. For a product, any unwanted radiation from the side—and backside exposure, as for example IR-noise, needs to be shielded, for example by simple packaging efforts on device or wafer level, e.g. backside metal coating. Preferably, the optical element designed in or on the substrate and/or the cover is aligned with the electromagnetic radiation detecting/emitting unit, such that incoming or emitted radiation can be collected and transferred in form of a focused beam or an array for individually focused beams to the electromagnetic radiation detecting unit, such that sensitivity of the sensor micro-device can be enhanced. According to one embodiment, a layer of metal as for example Al, Ti, Cr or the like may be provided in form of an optical intransparent layer on the outside, directly on the cap wafer or on the multi-layer thin film stack. This metal layer provided so as to define the aperture of the IR radiation window.

To avoid a deterioration of the filtering anti-reflective coating in form of the multi-layer thin film stack, according to a further embodiment at least one multi-layer thin film stack may be arranged in a depression provided in the cover/substrate/wafer such that an outer surface of the multi-layer thin film stack is recessed relative to a native surface of cover, substrate and wafer, respectively. Outer surface of the cover in this context means a substrate far surface of the cover. Outer surface of the substrate in this context means a cover far surface of the substrate. Both outer surfaces may be a native surface of the cover and the substrate, respectively. By such a depressed arrangement relative to the surrounding surface of cover/substrate/wafer scratching and deterioration of the multi-layer thin film stack can be prevented or at least decreased.

According to a further embodiment of the invention, on the substrate far side of the cover or cover wafer a surface texture (for example in form of a so called moth-eye structure) may be provided. This surface texture on the outside of cavity preferably is combined with a multi-layer thin film stack provided on the substrate near side of the cover/cover wafer.

According to a preferred embodiment of the invention, a getter material is arranged within the cavity, such that a high quality vacuum can be provided within the electromagnetic radiation sensor micro-device. The getter layer may be arranged in such a manner around the optical window of the cover that an optical aperture is formed.

On the method side, the invention refers to a method for manufacturing an electromagnetic radiation sensor micro device, comprising the steps of a) providing a substrate wafer and a cover wafer, at least one of the substrate wafer and the cover wafer at least in part consisting of an electromagnetic radiation transparent material, b) providing a reflection reducing coating on at least one of the substrate wafer and the cover wafer by arranging a multi-layer thin film stack on said at least one of the substrate wafer and the cover wafer in form of at least one first layer and at least one second layer which first and second layers are arranged one upon the other, c) performing wafer bonding of the cover wafer and the substrate wafer, such that at least one cavity per electromagnetic radiation micro device is defined between substrate wafer and cover wafer.

Concerning properties and features of the wafers, reference is made to the above description of the device and the wafer of the invention.

The above method can comprise a further step d) which step is performing wafer dicing after step c) to singularize each electromagnetic radiation micro device. With the method according to the invention, electromagnetic radiation sensor micro devices can be produced in parallel on wafer level. Preferably, vacuum wafer level packaging is used, which has proven to be a feasible and high yield process of producing miniaturized yet reliable devices. The parallel vacuum encapsulation of several devices on one substrate in a single process enables high throughput and low costs. By using the method of the invention contrary to the state of the art the optical quality is not limited or diminished.

Wafer bonding may be based on metallic seal bonding, anodic bonding, glass frit bonding or low temperature direct bonding. Metallic seal bonding may be based on eutectic Au alloys, e.g. AuSn or AuSi, AuSiGe, AuIn or any other solder alloys with liquid temperature <450° C. Au—Au thermo-compression bonding is also a feasible method. The wafer bonding sequence preferably includes an outgassing step before the wafers are forced together and heated. Getter activation may be performed before or after the seal is formed. Cooling down of the bonded wafer stack usually completes the operation. A dedicated dicing process may then be applied to singularize the devices.

In a preferred embodiment in step b) first said first layer is arranged on the at least one of the substrate wafer and the cover wafer and wherein the second layer is arranged on top of the first layer afterwards. As first layer a germanium layer and as second layer a zink sulfide layer may be provided. Wafer bonding in step c) may be performed with a temperature in a range of about 200° C. to 1000° C., preferably in a range of about 250° C. to 600° C. and more preferred in a range of about 280° C. to 450° C.

At least one multi-layer thin film stack can be provided on each side of the at least one of the cover wafer and the substrate wafer. Especially, on one side of the at least one of the cover wafer and the substrate wafer a first multi-layer thin film stack with a stack thickness between about 8 to 30 µm (acting as an electromagnetic radiation filter) can be provided, while on an opposite side a second thin film or multi-layer thin film stack with a stack thickness between about 2 to 5 µm can be provided, wherein the first multi-layer thin film stack may be deposited under lower temperature than the second multi-layer thin film stack.

A getter material may be provided in the at least one cavity between substrate wafer and cover wafer and the getter material may be activated under high temperature in a range of about 300° C. to 400° C., preferably under a temperature of about 350° C.

At least one multi-layer thin film stack may be deposited onto the at least one of the substrate wafer and the cover wafer after wafer bonding of step c).

Figure 2:
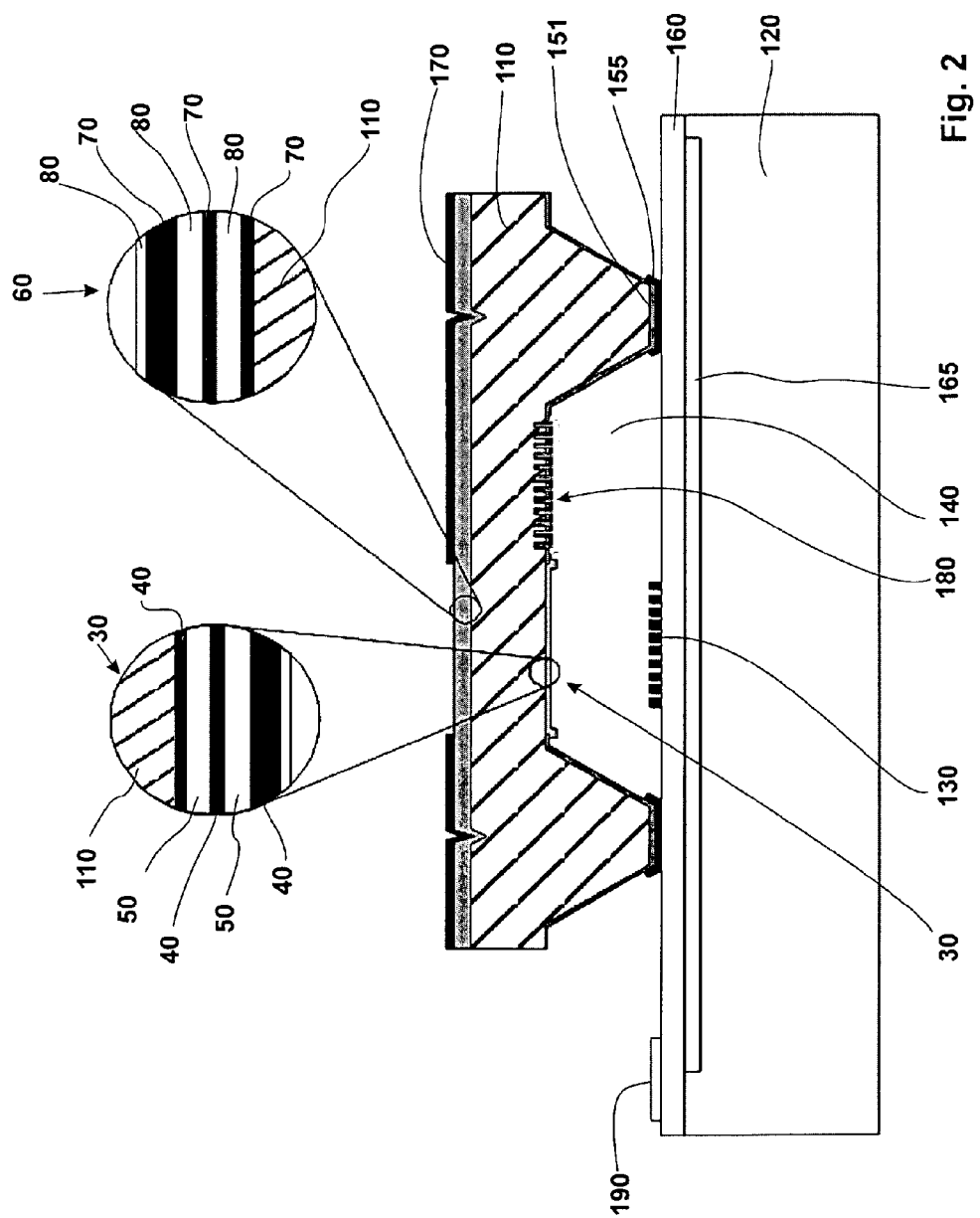
Figure 3:
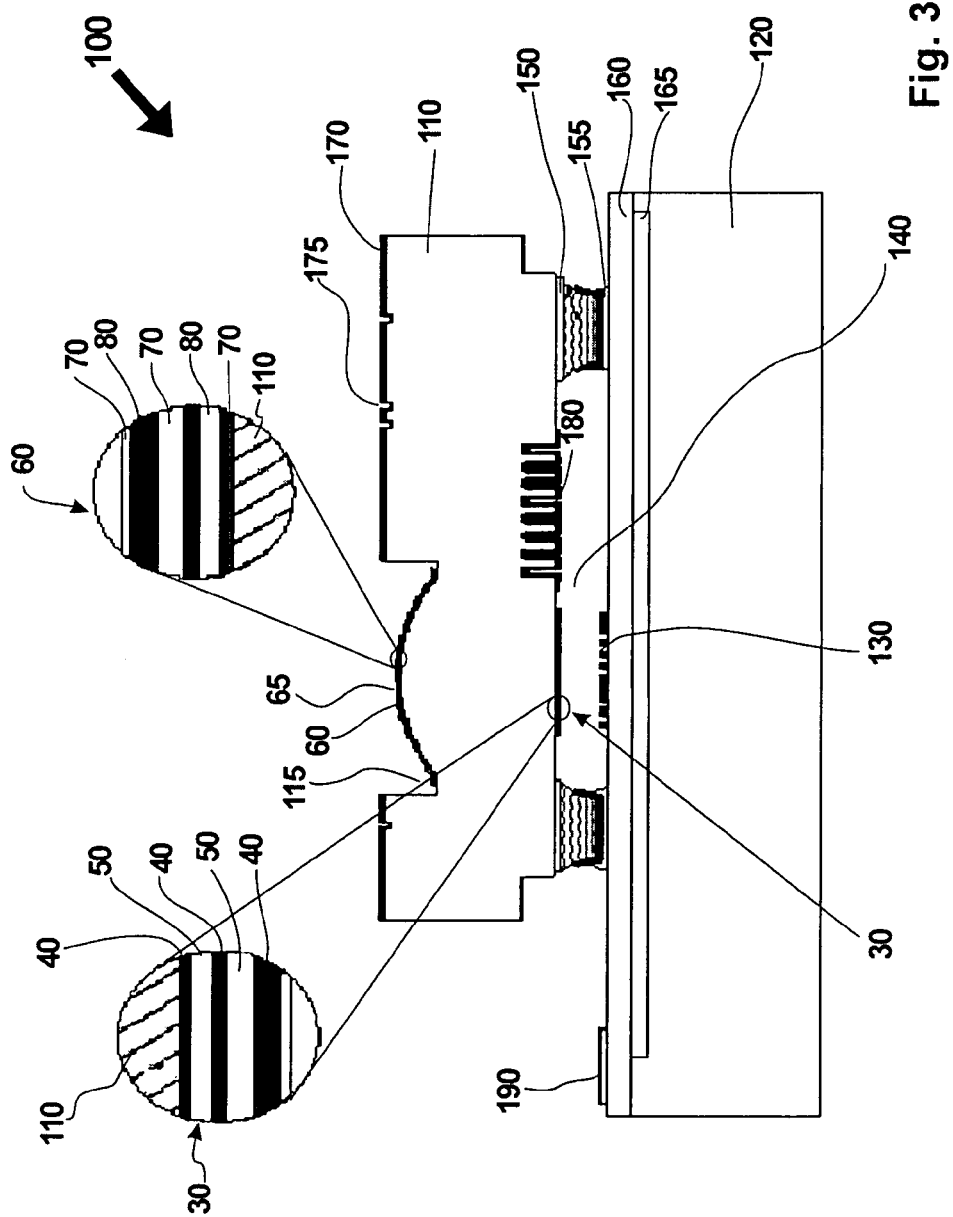

In order to describe the invention preferred embodiments are described, by way of non-limiting example only, with reference to the accompanying drawings, in which:

FIG. 1 shows a device according to the invention comprising an IR-filter, which device according to a first preferred embodiment is produced with additive frame technology, FIG. 2 shows a device according to the invention comprising an IR-filter, which device according to a second preferred embodiment comprises a KOH etched cavity and FIG. 3 shows a device according to the invention comprising an IR-filter and an additional optical element.

Figure 4:
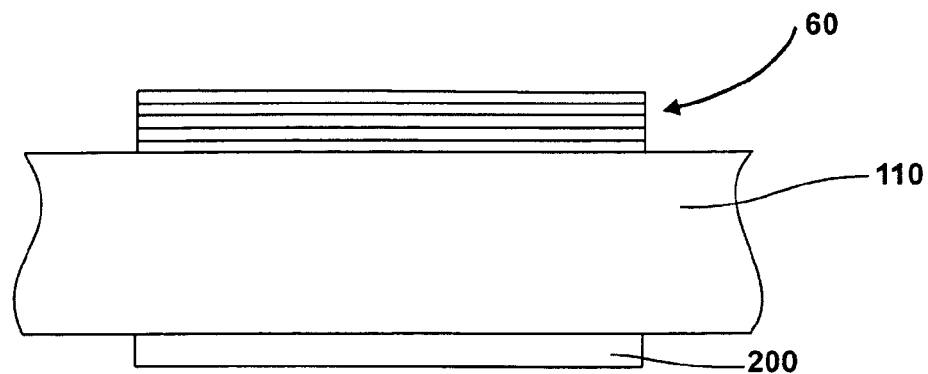
Figure 5:
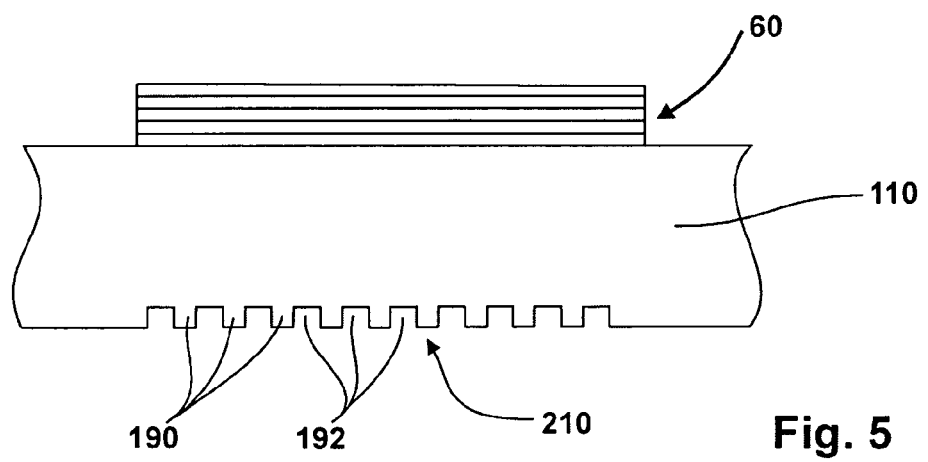
Figure 6:
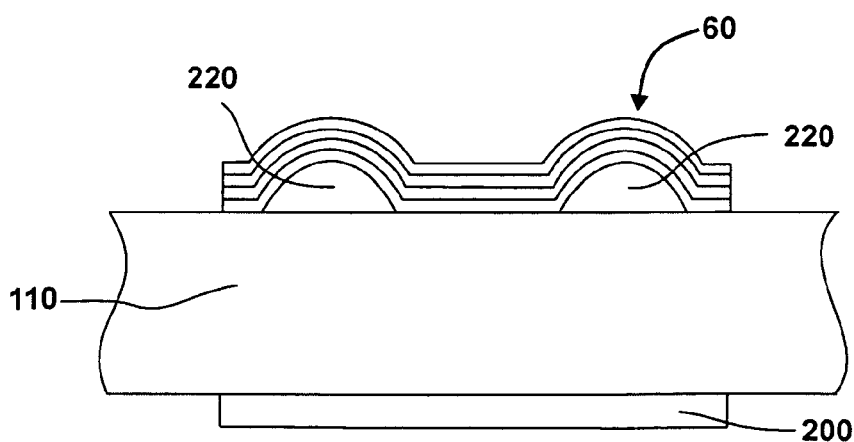
Figure 7:
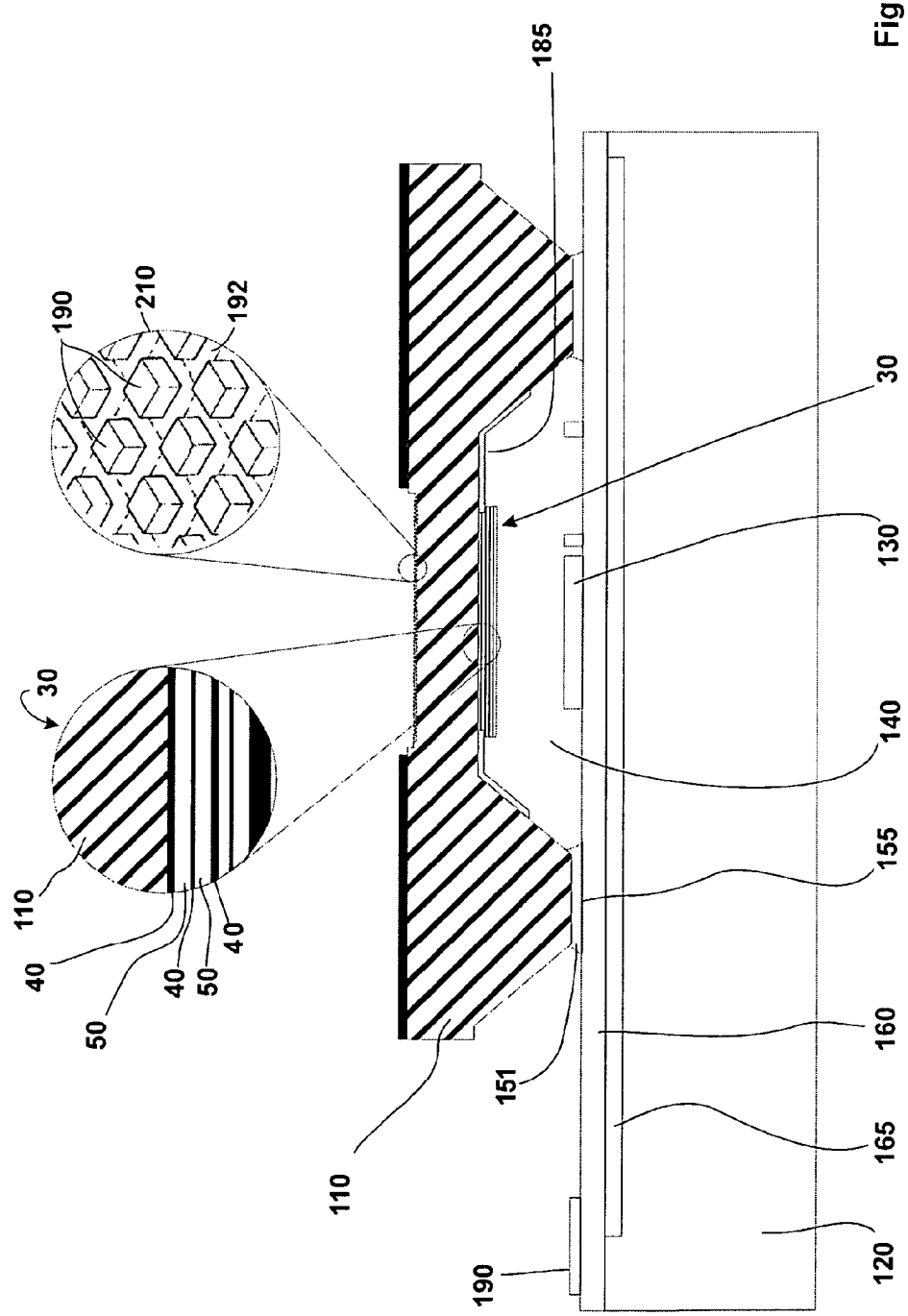

FIG. 4 shows a combination according to the invention of a GeZnS-multi-layer-filter with a single film of AlN or DLC as an antireflective coating, FIG. 5 shows a combination according to the invention of a GeZnS-multi-layer-filter with a moth eye-structure as an antireflective structure, FIG. 6 shows a combination according to the invention of an optical element covered with a GeZnS-multi-layer thin film combined with a moth eye structure and FIG. 7 shows another embodiment of FIG. 5 with an optical aperture layer (185) inside the cavity. The aperture layer may act as getter at the same time.

In the following description of preferred embodiments of the invention in the different embodiments and figures identical reference numbers are used for identical features and the disclosure of such identical features are valid for any of the different embodiments.

An infrared radiation micro device 100 according to the invention is shown in FIG. 1 in a cross section of a representative package construction. The device 100 comprises a substrate 120 for example made from silicon and a cover 110 for example made from silicon. For substrate 120 and cover 110 wafers with a diameter of 100 mm or larger and a thickness of not less than 300 µm are used; although other infrared transparent substrate materials such as germanium are suitable. A double side polished, high resistivity silicon cover wafer with more than 1 Ohm·cm resistance, low crystal defect density and low oxygen content is preferred to fabricate the cover 110 to reduce the infrared absorption in the material of the cover 110.

Substrate 120 and cover 110 are bonded with an additive frame technology providing a distance frame 150 arranged between substrate 120 and cover 110. By the use of the distance frame 150 a cavity 140 is provided between substrate 120 and cover 110. The cavity is hermetically sealed. A bolometer sensor unit 130 acting as an electromagnetic radiation detecting unit and a getter layer 115 are arranged in the cavity 140 and enclosed by the distance frame 150.

The distance frame 150 is made of silicon and has rounded side walls at least for a part of the vertical height. The crystal structure of this silicon frame may vary over the frame geometry in lengths and widths from epitaxical monocristalline silicon to partly poly-cristalline or poly-cristalline. An interface layer 151 between distance frame 150 and silicon cover 110 may be present, consisting of a dielectric film such as TEOS, SiO2, SiN or a silicon nucleation layer. The silicon distance frame 150 is deposited in an additive process. Deposition of the distance frame 150 may be after a generation of reflection reducing coatings 40, 60 has been performed on the cover 110. Although the distance frame height can vary between 1 µm to 500 µm and the width can vary between 20 µm and some mm a width of around 180 µm and a height of around 70 µm is chosen in this example.

A metallic seal bond 155 connected with a contact 190 joints the distance frame 150 to the sensor substrate 120. The seal bond is located on top of a part of the integrated read out circuit 165. A hermetic metallic seal can be formed with different metallurgies ranging from soft solder alloys over transient liquid phase formation, intermetallic diffusion bonds, thermocompression bonds to eutectic bonding. Two different eutectic techniques are preferred: eutectic gold-tin wafer bonding at around 300° C. and eutectic gold-silicon wafer bonding at around 400° C. The disclosed technique takes advantage of techniques according to which a cover wafer can be used to hermetically seal a microstructure in a cavity based on a metallic seal bond at temperatures between 265° C. and 450° C. with a wetting buffer around the seal frame for surplus liquid melt. In both cases gold rings are deposited by electroplating, preferably with a thickness around 3 μm. A tin layer is deposited by electroplating, preferably with a thickness of not less than 2 μm. The technology depends mostly on the temperature tolerance of the sensor components to be encapsulated. Both bond techniques are performed in a high vacuum environment. After seal formation, the hermetic seal maintains the vacuum inside the cavity 140 and protects the device against the environment.

The periphery of the lower side of the cover has a recessed area 118, in the range of 800 nm to 60 μm, relative to the cavity ceiling to allow for larger process tolerances during the cap dicing process. In this example a recess depths of around 20 μm is generated. The outward surface of the cover is coated with an infrared barrier layer 170 that has openings only in the marking area 175 and the infrared window area 117. The infrared window 117 is recessed relative to the outward surface of the cover for scratch protection (depression 65). An acceptable range for the depth of depression 65 is between 0 μm to 50 μm; in some applications no recess may be necessary. In this example a recess depths of about 8 μm for the infrared window is preferred. The infrared window 117 is positioned above the bolometer sensor unit 130 and is preferably 0 μm to 200 μm larger than the sensor unit to compensate for alignment tolerances during the wafer bonding process. In this example an oversizing of 60 μm of each side of the window is preferred.

In the depression 65 within the infrared window 117 a reflection reducing coating 60 is arranged. The reflection reducing coating 65 is able to reduce reflection of incoming electromagnetic radiation. At the same time the coating 65 acts as a filter device filtering certain elected ranges of wavelength of incoming radiation. The reflections reducing coating 65 can act as a low pass filter which blocks short wavelengths (which have a high frequency) and improves the transmission of infrared radiation through the material of substrate and/or cover while at the same time short infrared wavelengths in a range of about 1 μm to 7.5 μm, preferably 2.5 μm to 5.5 μm are blocked. The cut off wavelength below of which incoming electromagnetic radiation is blocked is in the range of 5 μm to 9 μm or in the range of 5.5 μm to 8 μm.

The reflection reducing coating 65 is arranged as a multi-layer thin film stack 60 and comprises several first layers 70 and several second layers 80. In the example shown in FIG. 1 the coating 65 comprises three first layers 70*a*, 70*b* and 70*c* as well as three second layers 80*a*, 80*b* and 80*c*. The first and second layers are stacked one upon the other in an alternating manner. This means that the first layer 70*a* is arranged on the cover 110, the second layer 80*a* is arranged on the first layer 70*a*, the first layer 70*b* is arranged on the second layer 80*a*, the second layer 80*b* is arranged on the first layer 70*b*, the first layer 70*c* is arranged on the second layer 80*b* and the second layer 80*c* is arranged on the first layer 70*c*. The multi-layer thin film stack 60 comprises a germanium layer (Ge-layer) as first layers 70*a, b, c* and a zink sulfide layer (ZnS-layer) a second layers 80*a, b, c*.

There are different refractive indexes of the first and second layers 70, 80. The thickness of the first and second layers 70, 80 is such that for a certain range of wavelength to be filtered or blocked there is destructive interference at the boundary interfaces between adjacent first layers 70 and second layers 80.

On the inner side of the cover 110 is a separate reflection reducing coating 30. Reflection reducing coating 30 also provides a filter device for the incoming radiation and comprises in the example of FIG. 1 first layers 40*a*, 40*b* and 40*c* as well as second layers 50*a*, 50*b* and 50*c*.

The bolometer array 130 within package cover 100 is fabricated on the semiconductor substrate 120 of silicon on top of the final wafer passivation 160 covering an integrated read out circuit 165. Sensor pixels are aligned in rows and columns of a rectangular matrix. In most applications, array 130 is operated uncooled at room or ambient temperature. Operation in the temperature range between −50° C. up to +80° C. is possible. The package cover 100 allows the operation also at temperatures near 0 K due to the use of a construction based on pure silicon which minimizes thermo mechanical stresses. Operation in harsh environments is therefore possible. The integrated read out circuit 165 measures the resistance changes in each bolometer due to the absorbed incident infrared radiation from a warm body, processes the signals and wires the signals out below the final wafer passivation 160 to the electrical contact pads 190 outside the distance frame 150.

FIG. 2 shows an example similar to FIG. 1 wherein the cavity 140 is KOH-etched into the cover 110. On the outside of the cover 110 there is provided a first multi-layer thin film stack 60 and on the inside of the cover 110 there is provided a second multi-layer thin film stack 30. Further details already were explained with reference to the example of FIG. 1.

FIG. 3 shows a third example of the present invention. The device 100 according to FIG. 3 in general is similar the device 100 according to FIG. 1. Deviating from the embodiment of FIG. 1 the depression 117 in the cover 110 does not have a flat surface, but a lens shape. The multi-layer thin film stack 60 is arranged on top of this lens shape, such that there is an optical element comprising IR-filtering properties.

As shown in FIGS. 4, 5 and 6, the multi-layer thin film stack 60 on the outside of the cover 110 of any embodiment of FIGS. 1, 2 and 3 can be combined with a single layer thin film 200 (FIG. 4) or a moth eye structure 210 (FIG. 5) instead of a second multi-layer thin film stack 30. The single layer thin film 200 can be a single layer thin film as AlN, Ge, ZnS, DLC or another adequate material. As shown in FIG. 5, the inner surface of the cover 110 can be structured with a defined texture of posts 191. The posts 191 are etched by reactive ion etching into the silicon substrate 110 to reduce the material density which lowers the effective refractive index of the silicon surface. The accurate etched shape depends on the selected centre wavelengths to pass the silicon cover and the form of the posts. The posts have all the same etch depths and preferably the same side wall angle, which are in this example between 1300 to 1700 nm deep and around 90° side angle for a centre wavelength of 10 μm. Although the contour of the posts can be chosen arbitrarily between round, square, star shape and other forms this example prefers round cylindrical posts of a diameter around 1500 nm standing up from a lower bottom surface having all the same top surface level. The posts have a defined spacing 192, in this example around 1100 nm. FIG. 6 shows that an optical element like a lens shaped structure 220 covered with a multi-layer thin film stack 60 is combined with a single layer thin film 200 or surface texture.

It is also part of the invention to provide the moth-eye structure 210 shown FIG. 5 on the outside, i.e. the substrate far side of the cover, and to provide the multi-layer thin film stack 60 on the inside, i.e. the substrate near side of the cover. Such an embodiment is shown in FIG. 7.

The invention claimed is:

1. An electromagnetic radiation micro device for detecting electromagnetic radiation comprising:
   a substrate;
   a cover, the substrate and the cover providing an hermetic sealed cavity; and
   an electromagnetic radiation detecting unit arranged within the cavity;
   wherein the cover at least in part having an electromagnetic radiation transparent material and comprising a first and second reflection reducing coating,
   wherein each reflection reducing coating is configured as a multi-layer thin film stack comprising at least a first layer consisting of a first material and at least a second layer consisting of a second material different than the first material, wherein the first and second layers are arranged upon each other;
   wherein each first layer has a first refractive index and each second layer has a second refractive index, different from the first refractive index of said first-layer,
   wherein each first layer and each corresponding second layer in combination have a thickness configured to provide destructive interference within a predetermined wavelength range of electromagnetic radiation;
   and providing the first reflection reducing coating on an outside of the cover wafer as a first multi-layer thin film stack having a layer thickness between 11 μm and 30 μm, and acting as an electromagnetic radiation filter, and providing the second reflection reducing coating on an opposite side of the cover wafer as a second multi-layer thin film stack with a different layer thickness between 2 μm and 5 μm.

2. The electromagnetic radiation micro device according to claim 1, wherein each multi-layer thin film stack comprises a germanium layer as the first layer and a zinc sulfide layer as the second layer.

3. The electromagnetic radiation sensor micro device according to claim 1, wherein a reflection reducing coating is provided on each side of the substrate.

4. The electromagnetic radiation sensor micro device according to claim 1, wherein several multi-layer thin film stacks are arranged one upon the other,
   wherein each multi-layer thin film stack comprises at least a first layer and at least a second layer arranged one upon the other,
   wherein layer thicknesses of said first and second layers of a first multi-layer thin film stack are different from layer thicknesses of said first and second layers of a second multi-layer thin film stack.

5. The electromagnetic radiation sensor micro device according to claim 1, wherein at least one of the substrate and the cover at least partly is designed in form of an optical element.

6. The electromagnetic radiation sensor micro device according to claim 5, wherein said optical element is covered by said at least one multi-layer thin film stack.

7. The electromagnetic radiation sensor micro device according to claim 1, wherein the first multi-layer thin film stack is arranged in a depression provided in said cover such that an outer surface of the multi-layer thin film stack is recessed relative to a native surface of the cover.

8. The electromagnetic radiation sensor micro device according to claim 1, wherein a getter material is arranged within the cavity.

9. The electromagnetic radiation sensor micro device according to claim 1, wherein the first multi-layer thin film stack is deposited with a lower temperature than the second multi-layer thin film stack.

10. The electromagnetic radiation sensor micro device according to claim 1, wherein at least one of the substrate and the cover at least partly is designed in form of an optical element and the optical element is aligned with the electromagnetic radiation detecting unit as an optical IR unit, such that incoming IR radiation is collected and transferred in form of a focused beam or an array for individually focused beams to the electromagnetic radiation detecting optical IR unit.

* * * * *